United States Patent
Ayotte et al.

(10) Patent No.: US 10,245,667 B2
(45) Date of Patent: Apr. 2, 2019

(54) CHIP JOINING BY INDUCTION HEATING

(71) Applicant: GlobalFoundries Inc., Grand Cayman (KY)

(72) Inventors: Stephen P. Ayotte, Bristol, VT (US); Glen E. Richard, Essex Junction, VT (US); Timothy D. Sullivan, Underhill, VT (US); Timothy M. Sullivan, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 7 days.

(21) Appl. No.: 15/654,130

(22) Filed: Jul. 19, 2017

(65) Prior Publication Data

US 2017/0312841 A1 Nov. 2, 2017

Related U.S. Application Data

(62) Division of application No. 14/043,047, filed on Oct. 1, 2013, now Pat. No. 9,776,270.

(51) Int. Cl.
*H05K 13/04* (2006.01)
*B23K 1/002* (2006.01)
(Continued)

(52) U.S. Cl.
CPC ............ *B23K 1/002* (2013.01); *B23K 1/0016* (2013.01); *H05K 3/3494* (2013.01);
(Continued)

(58) Field of Classification Search
CPC .... H05K 3/3494; H05K 3/3436; H05K 3/341; H05K 3/342; B23K 1/002; B23K 1/0016;
(Continued)

(56) References Cited

U.S. PATENT DOCUMENTS

| 2,483,577 A | * | 10/1949 | Fahnoe | H01H 85/42 337/161 |
| 2,502,992 A | * | 4/1950 | Rawlins | H01H 85/042 337/158 |

(Continued)

FOREIGN PATENT DOCUMENTS

| JP | 4985536 B2 | 7/2012 |
| JP | 5029279 B2 | 9/2012 |

OTHER PUBLICATIONS

Failure Modes of Lead Free Solder Bumps Formed by Induction Spontaneous Heating Reflow, Jnl. of Material Science and Technology, p. 61, vol. 23, No. 1, 2007.

*Primary Examiner* — Peter DungBa Vo
*Assistant Examiner* — Kaying Kue
(74) *Attorney, Agent, or Firm* — Thompson Hine LLP; Anthony Canale

(57) ABSTRACT

Methods and apparatus for joining a chip with a substrate. The chip is moved by with a pick-and-place machine from a first location to a second location proximate to the substrate over a first time. In response to moving the chip in a motion path from the first location to the second location, a plurality of solder bumps carried on the chip are liquefied over a second time that is less than the first time. While the solder bumps are liquefied, the chip is placed by the pick-and-place machine onto the substrate.

8 Claims, 4 Drawing Sheets

(51) Int. Cl.
*B23K 1/00* (2006.01)
*H05K 3/34* (2006.01)

(52) U.S. Cl.
CPC ..... *H05K 3/3436* (2013.01); *H05K 2203/101* (2013.01); *Y10T 29/49144* (2015.01); *Y10T 29/53178* (2015.01)

(58) Field of Classification Search
CPC .......... Y10T 29/49144; Y10T 29/4913; Y10T 29/53191; Y10T 29/5313; Y10T 29/53174; Y10T 29/53178
USPC .................. 29/832–841, 740, 741, 739, 743
See application file for complete search history.

(56) References Cited

U.S. PATENT DOCUMENTS

| | | | | |
|---|---|---|---|---|
| 3,781,978 A * | 1/1974 | Intrator | ............... | H01L 21/50 156/273.1 |
| 3,887,996 A * | 6/1975 | Hartleroad | ........ | H01L 21/67144 438/111 |
| 3,887,997 A * | 6/1975 | Hartleroad | ........ | H01L 21/67144 198/381 |
| 3,902,940 A * | 9/1975 | Heller, Jr. | ........... | B29C 44/1228 156/272.4 |
| 3,945,867 A * | 3/1976 | Heller, Jr. | ............. | B29C 47/023 156/143 |
| 4,777,719 A * | 10/1988 | Yagi | ................... | H05K 13/0452 29/564.1 |
| 4,789,767 A * | 12/1988 | Doljack | ............. | H01R 43/0242 219/605 |
| 4,983,804 A * | 1/1991 | Chan | ...................... | B23K 1/002 219/616 |
| 5,087,804 A * | 2/1992 | McGaffigan | ........... | H05B 6/106 219/618 |
| 5,093,545 A * | 3/1992 | McGaffigan | ...... | B29C 66/53245 219/616 |
| 5,128,504 A * | 7/1992 | McGaffigan | ............ | B29C 65/32 156/272.4 |
| 5,208,443 A * | 5/1993 | McGaffigan | ........ | B29C 61/0625 156/272.4 |
| 5,285,949 A * | 2/1994 | Okikawa | .............. | B23K 20/007 228/179.1 |
| 5,319,173 A * | 6/1994 | McGaffigan | ........ | B29C 61/0625 219/634 |
| 5,630,958 A * | 5/1997 | Stewart, Jr. | ............ | H05B 6/101 219/637 |
| 5,651,176 A * | 7/1997 | Ma | ...................... | H05K 13/028 198/763 |
| 5,816,482 A * | 10/1998 | Grabbe | ............... | H01L 21/4853 228/212 |
| 5,927,589 A | 7/1999 | Yang et al. | | |
| 6,023,054 A * | 2/2000 | Johnson, Jr. | ........ | B29C 65/3616 219/634 |
| 6,254,923 B1 | 7/2001 | Boyd et al. | | |
| 6,257,887 B1* | 7/2001 | Heckerman | .............. | A61C 3/00 433/141 |
| 6,288,376 B1* | 9/2001 | Tsumura | ................ | B23K 1/002 219/635 |
| 6,776,327 B2 | 8/2004 | Bok et al. | | |
| 6,818,543 B2 | 11/2004 | Bendat et al. | | |
| 6,894,256 B2* | 5/2005 | Balla | .................. | B29C 65/3656 156/379.6 |
| 6,991,967 B2* | 1/2006 | Liu | ................... | H01L 21/67132 438/118 |
| 7,064,004 B2* | 6/2006 | Frutschy | ................ | H01L 24/81 257/E21.511 |
| 7,120,995 B2* | 10/2006 | Vischer | ............ | H01L 21/67144 29/740 |
| 7,290,331 B2 | 11/2007 | Onobori et al. | | |
| 7,335,864 B2* | 2/2008 | Peck | ........................ | F27B 5/14 219/674 |
| 7,555,832 B2* | 7/2009 | Guth | ................. | H01L 21/67005 29/739 |
| 7,591,409 B2* | 9/2009 | Naito | .................... | B23K 20/10 228/103 |
| 7,814,645 B2* | 10/2010 | Mizuno | ................... | B23K 1/06 219/534 |
| 7,854,365 B2 | 12/2010 | Li et al. | | |
| 7,878,385 B2 | 2/2011 | Kumar et al. | | |
| 7,980,444 B2* | 7/2011 | Ebihara | ................... | H01L 24/75 228/1.1 |
| 8,012,866 B2 | 9/2011 | Tu et al. | | |
| 8,254,140 B2* | 8/2012 | Lee | ......................... | H01L 24/16 361/767 |
| 8,313,958 B2* | 11/2012 | Swaminathan | ......... | H01L 24/11 257/E21.499 |
| 8,317,077 B2 | 11/2012 | Hwang et al. | | |
| 8,328,066 B2* | 12/2012 | Fujita | ..................... | H01L 24/75 228/1.1 |
| 8,420,989 B2* | 4/2013 | Kim | .................... | B23K 1/0016 219/635 |
| 8,592,735 B2* | 11/2013 | Hirota | ................... | H05B 6/365 219/645 |
| 9,190,375 B2* | 11/2015 | Ayotte | .................... | H01L 24/13 |
| 9,259,799 B2* | 2/2016 | Kim | ..................... | B23K 20/106 |
| 9,776,270 B2* | 10/2017 | Ayotte | ................. | B23K 1/0016 |
| 2003/0025984 A1* | 2/2003 | Gudeman | .......... | G02B 26/0808 359/291 |
| 2005/0227429 A1* | 10/2005 | Minamitani | ........... | B23K 20/10 438/222 |
| 2005/0241143 A1* | 11/2005 | Mizuno | .................. | H01L 24/75 29/739 |
| 2007/0023486 A1* | 2/2007 | Matsuura | ............... | B23K 1/002 228/179.1 |
| 2008/0229575 A1* | 9/2008 | Guth | ................. | H01L 21/67005 29/832 |
| 2009/0175010 A1* | 7/2009 | Iriguchi | ............... | H05K 1/0212 361/761 |
| 2009/0265724 A1 | 10/2009 | Jibbe et al. | | |
| 2009/0265924 A1* | 10/2009 | Ebihara | ................... | H01L 24/75 29/739 |
| 2010/0115763 A1* | 5/2010 | Kim | ...................... | H01L 24/81 29/740 |
| 2011/0271996 A1* | 11/2011 | Hahn | .................... | B23K 1/0016 136/244 |
| 2013/0139380 A1* | 6/2013 | Lee | ......................... | H05K 3/32 29/739 |
| 2013/0234298 A1* | 9/2013 | Mitsugi | .................. | B23K 26/18 257/629 |
| 2013/0250994 A1* | 9/2013 | Moenster | ........... | H01S 5/02272 372/50.12 |
| 2013/0255079 A1* | 10/2013 | Maijala | .................. | B23K 1/0016 29/832 |
| 2015/0055311 A1* | 2/2015 | Kawarai | ................ | H05K 1/0233 361/782 |

* cited by examiner

CHIP JOINING BY INDUCTION HEATING

BACKGROUND

The invention relates generally to semiconductor packaging and, in particular, to systems and methods for joining a chip to a substrate.

A die or chip includes integrated circuits formed by front-end-of-line processing using the semiconductor material of a wafer, a local interconnect level formed by middle-end-of-line processing, and stacked metallization levels of an interconnect structure formed by back-end-of line processing. After the wafer is diced, each chip may be joined with a substrate using a controlled collapse chip connection or flip chip process. In a flip chip process, reflowed solder bumps provide mechanical and electrical connections between pads in the top metallization level of the chip and a complementary set of pads on the substrate. The solder bumps can be formed on the pads of the chip using any number of techniques, including electroplating, evaporation, printing, and direct placement. Reflow of the solder bumps establishes solder joints physically and electrically connecting the pads on the chip with the complementary set of pads on the substrate.

Systems and methods for joining a chip to a substrate are needed that improve on existing joining systems and methods.

SUMMARY

In an embodiment of the invention, a method is provided for joining a chip with a substrate. The method includes moving the chip with a pick-and-place machine in a motion path from a first location to a second location proximate to the substrate over a first time. In response to moving the chip from the first location to the second location, a plurality of solder bumps carried on the chip are liquefied over a second time that is less than the first time. While the solder bumps are liquefied, the chip is placed by the pick-and-place machine onto the substrate.

In an embodiment of the invention, an apparatus is provided for joining a chip with a substrate. The apparatus comprises a pick-and-place machine and an induction heater. The pick-and-place machine includes a pick-up head configured to releasably hold the chip and a robotic arm configured to move the pick-up head. The induction heater is located in a motion path of the chip to the substrate and is configured to heat solder bumps on the chip by electromagnetic induction while the chip is releasably held by the pick-up head.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
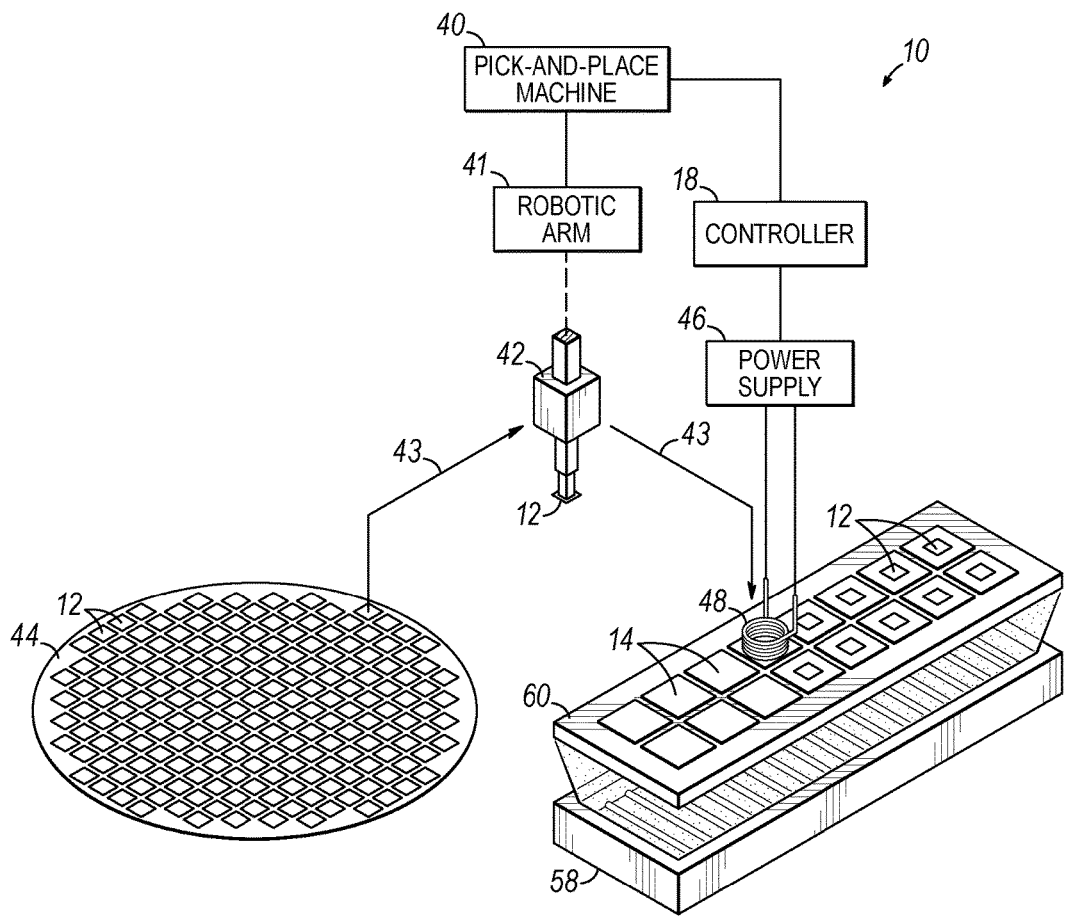
FIG. 1 is a diagrammatic view of an induction heating system in accordance with an embodiment of the invention.
Figure 2:
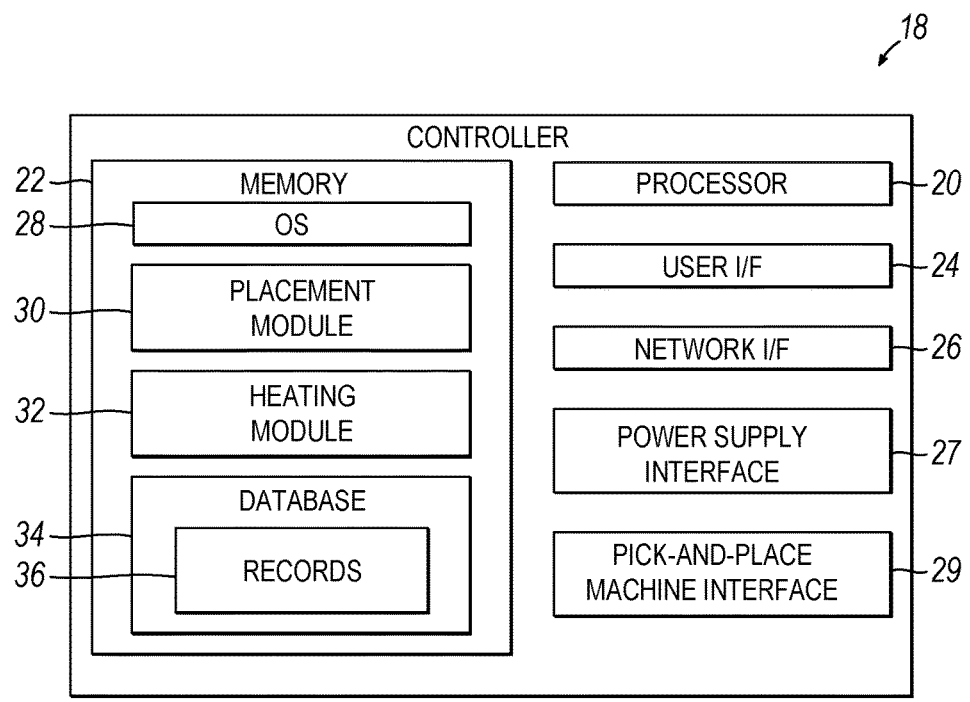
FIG. 2 is a block diagram of the controller in FIG. 1.

With reference to FIGS. 1-4 and in accordance with an embodiment of the invention, a system 10 configured to use induction heating to form solder joints 16 between a chip 12 and a substrate 14 is shown. The system 10 includes a controller 18 with at least one processor 20 including at least one hardware-based microprocessor and a memory 22 coupled to the at least one processor 20. The memory 22 may represent the random access memory (RAM) devices comprising the main storage of controller 18, as well as any supplemental levels of memory, e.g., cache memories, non-volatile or backup memories (e.g., programmable or flash memories), read-only memories, etc. In addition, memory 22 may be considered to include memory storage physically located elsewhere in the controller 18, e.g., any cache memory in a microprocessor, as well as any storage capacity used as a virtual memory, e.g., as stored on a mass storage device or on another computer coupled to the controller 18.

For interfacing with a user or operator, the controller 18 may include a user interface 24 incorporating one or more user input/output devices, e.g., a keyboard, a pointing device, a display, a printer, etc. Otherwise, input may be received via another computer or terminal over a network interface 26 coupled to a communication network. The controller 18 also may be in communication with one or more mass storage devices, which may be, for example, internal hard disk storage devices, external hard disk storage devices, external databases, storage area network devices, etc.

The controller 18 typically operates under the control of an operating system 28 and executes or otherwise relies upon various computer software applications, components, programs, objects, modules, engines, data structures, etc., including for example, a placement module 30 and a heating module 32. In general, the placement module 30 may be configured to control the operation of a pick-and-place tool or machine 40 when its instructions are executed by the at least one processor 20 of the controller 18 in order to pick up each chip 12 and transfer each chip 12 from a storage location 44 to the substrate 14. The storage location 44 may comprise a wafer or may comprise a chip bank. The heating module 32 may be configured to control the operation of a power supply 46 when its instructions are executed by the at least one processor 20 of the controller 18 in order to power an induction heater 48 during the chip attach process. Moreover, various applications, components, programs, objects, modules, etc. may also execute on one or more processors in another computer coupled to the controller 18 via the communication network, e.g., in a distributed or client-server computing environment, whereby the processing required to implement the functions of a computer program may be allocated to multiple computers over a network. The memory 22 may store one or more data structures including, for example, a database 34 configured with records 36 to store data relating to the process (e.g., the position of each chip 12 at the storage location 44, instructions for the operation of the pick-and-place machine 40, control settings for the power supply 46, etc.

The pick-and-place machine 40, which is in communication with the controller 18 through a pick-and-place machine interface 29, includes a robotic arm 41 and at least one pick-up head 42. The pick-up head 42 is equipped with an acquisition device, such as pneumatic suction cups, capable of temporarily and releasably holding the chip 12. The robotic arm 41 is configured to move the pick-up head 42 over a motion path 43, which is diagrammatically indicated by the single-headed arrows in FIG. 1. The motion path 43 may originate at the storage location 44 where each chip 12 is picked by the pick-up head 42 and terminate at another location in the form of one of the substrates 14. The motion of the pick-up head 42 may be unbroken and continuous over the motion path 43.

The robotic arm 41 may be a programmable mechanical arm with links connected by joints allowing rotational motion and/or translational displacement of the pick-up head 42. The robotic arm 41 may be, for example, a three-axis R-Theta robot arm or a selectively compliant articulated robot arm (SCARA). The robotic arm 41 is configured to manipulate and accurately position the pick-up head 42 and to move the pick-up head 42 in response to program code executed by the at least one processor 20, user interaction with the user interface 24, and/or other instructions or input received by the at least one processor 20.

The substrates 14 may be located on a conveyor 60. The operation of the conveyor 60 may also be controlled by the controller 18. However, the substrates 14 may be held and/or moved in a different manner such as a device table or other platform. Each substrate 14 is held stationary by the conveyor 60 at the time of the physical contact between the chip 12 and substrate 14 during the joining process.

A heater 58 may be positioned relative to the conveyor 60 so that each substrate 14 can be heated, prior to chip-joining, to a temperature that approximates the temperature of the substrates 14 during use in an end product (e.g., 60° C. to 100° C.). The heater 58 may comprise a radiant heater configured to generate radiant energy, a lamp configured to generate light, or an air heater configured to generate warm air. The heater 58 may be configured to heat the substrates 14 from the frontside or from the backside.

The induction heater 48 is located proximate to the substrates 14. The induction heater 48 may be a freestanding structure or may include additional support structure to provide support. In a representative embodiment, the induction heater 48 may be a coil consisting of multiple turns of a conductor wound in helical configuration, and the time-varying magnetic field is formed in and around the turns of the coil as described by the Biot-Savart law.

The induction heater 48 is coupled with the power supply 46, which is in communication with the controller 18 through a power supply interface 27. Electrical power is supplied from the power supply 46 to the induction heater 48 in response to program code executed by the at least one processor 20, user interaction with the user interface 24, and/or other instructions or input received by the at least one processor 20. The power supply 46 may supply high-frequency alternating current to the induction heater 48. In one embodiment, the alternating current may be supplied to the induction heater 48 at a radio frequency, such as a frequency of 13.6 MHz.

The time variation in the high-frequency alternating current produces a time-varying magnetic field at the induction heater 48. The strength of the magnetic field generated by the induction heater 48 may be on the order of one (1) Tesla, but other field strengths may be applicable. In a representative embodiment, a coil operating as the induction heater 48 may have a diameter on the order of two (2) inches to three (3) inches with four (4) to five (5) turns and may be cooled by a cooling medium flowing through a hollow interior of the coil.

The induction heater 48 is dimensioned such that the chip 12 can be positioned while held by the pick-up head 42 at a location proximate to the induction heater 48 and the solder bumps 50 on the chip 12 influenced by the time-varying magnetic field. For example, a coil serving as the induction heater 48 may be dimensioned with an inner diameter that is large enough to receive the chip 12 so that the chip 12 can be moved axially by the pick-up head 42 through the interior of the coil turns. The induction heater 48, which may be located in proximity to the substrate 14 at all times of the pick and place operation and joining operation, may be fixed at a static or fixed location and be stationary relative to the pick-up head 42 of the pick-and-place machine 40. The pick-up head 42 of the pick-and-place machine 40 provides the motion of each chip 12 over the motion path 43 toward a target location given by the substrate 14 that is the intended recipient of the chip 12 and that is aligned with the induction heater 48. Each substrate 14 may be sequentially moved by the conveyor 60 into location proximate to the induction heater 48 when the particular substrate 14 is the targeted one for chip attachment.

The induction heater 48 may be located at a different position in the motion path 43 for the pick-up head 42 and its positioning is not limited to being located directly above the substrate 14 on the conveyor 60. The proximity of the induction heater 48 to the substrate 14 can be relaxed so long as the induction heater 48 is located in the motion path 43. For example, the induction heater 48 may be located with higher proximity relative to the storage location 44 for the chips 12 and lower proximity relative to the substrates 14 and conveyor 60. The robotic arm 41 can move the pick-up head 42 and chip 12 relative to the induction heater 48 to liquefy the solder bumps 50 on the chip 12 after movement over a segment of the motion path 43 and then, after heating with electromagnetic induction, continue to move the pick-up head 42 and chip 12 over the remainder of the motion path 43 to the substrate 14. The time required for movement of the chip 12 held by the pick-up head 42 over the remainder of the motion path 43, after heating, to place the chip 12 onto the substrate 14 is chosen such that the solder bumps 50 remain liquefied and in the liquid phase at the time of placement.

The chips 12 at the storage location 44 are formed by processing a wafer with front-end-of-line processes to fabricate one or more integrated circuits on each chip 12. The integrated circuits on each chip 12 are connected with each other and the external environment by an interconnect structure fabricated using middle-end-of line and back-end-of-line processes. The individual chips 12 may be singulated from the wafer by mechanical sawing, by scribing and breaking, by laser cutting, or by a different technique.

Figure 3A:
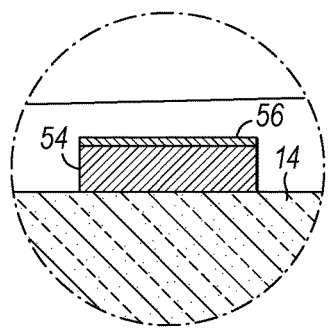
FIG. 3A is a cross-sectional view of a portion of FIG. 3 in which a pad on the substrate is depicted.
Figure 3:
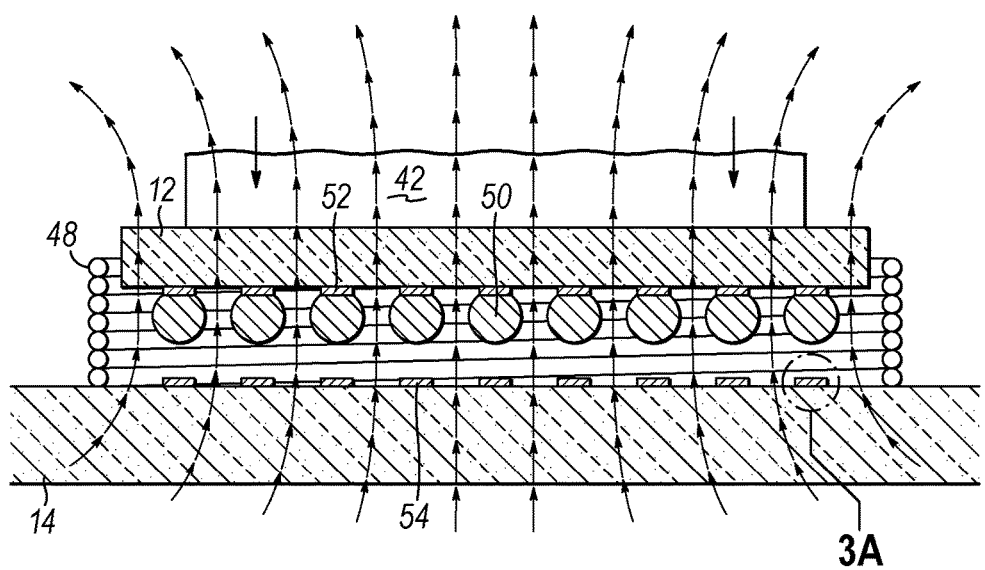
FIG. 3 is a cross-sectional view of the solder bumps on a chip while being heated with the induction heating system of FIGS. 1 and 2 prior to contact of the solder bumps with pads on a substrate.
Figure 4:
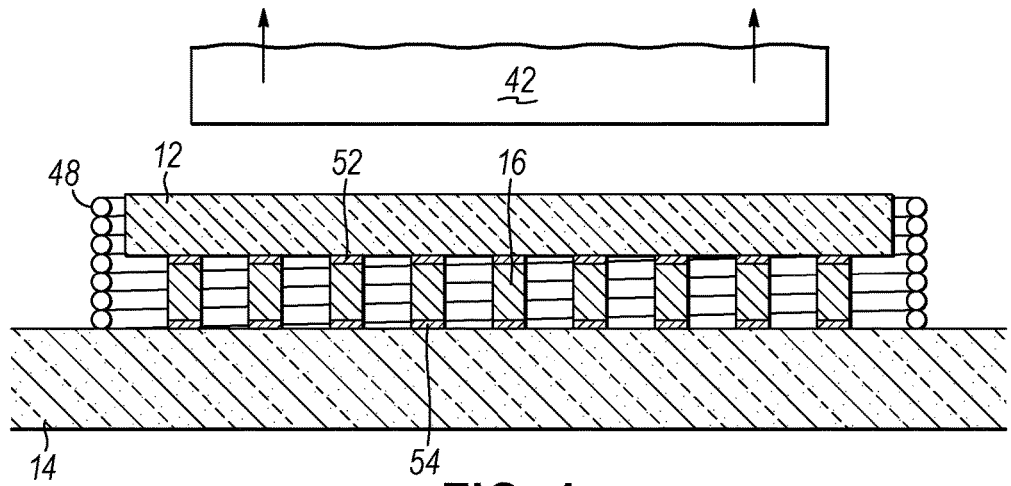
FIG. 4 is a cross-sectional view similar to FIG. 3 after the molten solder bumps have solidified to form solder joints coupling the pads on the chip with the pads on the substrate.

As best shown in FIG. 3, the chip 12 includes pads 52 formed in a topmost metallization level of the interconnect structure and solder bumps 50 that are formed on or placed onto the pads 52. The substrate 14 includes complementary pads 54 that participate in the chip joining process. When processed by the induction heater 48 of the system 10, the solder bumps 50 (FIG. 3) are transformed by heating with electromagnetic induction from a solid phase to a liquid phase. After placement to establish contact between the liquefied solder bumps 50 and the pads 54 on the substrate 14, the liquefied solder bumps 50 subsequently cool from the liquid phase back to the solid phase to form the solder joints 16 (FIG. 4).

The solder joints 16 are configured to permanently attach the chip 12 to the substrate 14. As best shown in FIG. 4, each solder joint 16 mechanically couples one of the chip pads 52 with one of the substrate pads 54. The solder joints 16 and pads 52, 54 provide electrical pathways for transferring signals between the integrated circuits of the chip 12 and an external device, such as a computing system, and electrical pathways for powering and grounding the integrated circuits of the chip 12.

The solder bumps 50 may be separately formed and transferred to the pads 52 by a controlled collapse chip connection (C4) technology. To that end, an area array of injection-molded solder bumps 50 is formed using bulk solder injected into cavities in a mold plate. The plate cavities match the locations of chip pads 52. The solder bumps 50 populating the cavities are transferred to each chip 12 by precisely aligning the bumps with the chip pads 52 and executing a reflow transfer. Alternatively, each solder bump 50 may be formed by electroplating to its chip pad 52 using an appropriate plating solution, anodes, and direct current supplied to the anodes.

The substrate 14 may be comprised of an organic material, such as a polymer or plastic that may optionally be reinforced. Alternatively, the substrate 14 may be comprised of a ceramic material. In an embodiment, the substrate 14 may be a leaded or leadless chip carrier that is comprised of either an organic material or a ceramic material.

The solder bumps 50 may be comprised of solder having a lead-free (Pb-free) composition, a eutectic tin/lead (Sn/Pb) composition, a high lead (Pb) composition, etc. The solder bumps 50 do not have to be comprised of a specially engineered solder material because the electromagnetic properties of existing solder materials may be adequate for coupling with the time-varying magnetic field to provide the eddy current heating causing the transition from a solid phase to a liquid phase.

The pads 52, 54 may be comprised primarily of aluminum (Al) or copper (Cu), and may further include one or more layers of other materials, such as titanium tungsten (TiW), nickel (Ni), etc., comprising under bump metallurgy. In particular, the pads 54 on the substrate 14 may include a layer 56 comprised of a material, such as Ni, that is heated by the induction heater 48. The localized heating of the layer 56 may warm the pad 54 to a given temperature, such as a given temperature that is less than the melting point of the solder comprising the solder bumps 50, and without significant warming of the remainder of the substrate 14.

Figure 5:
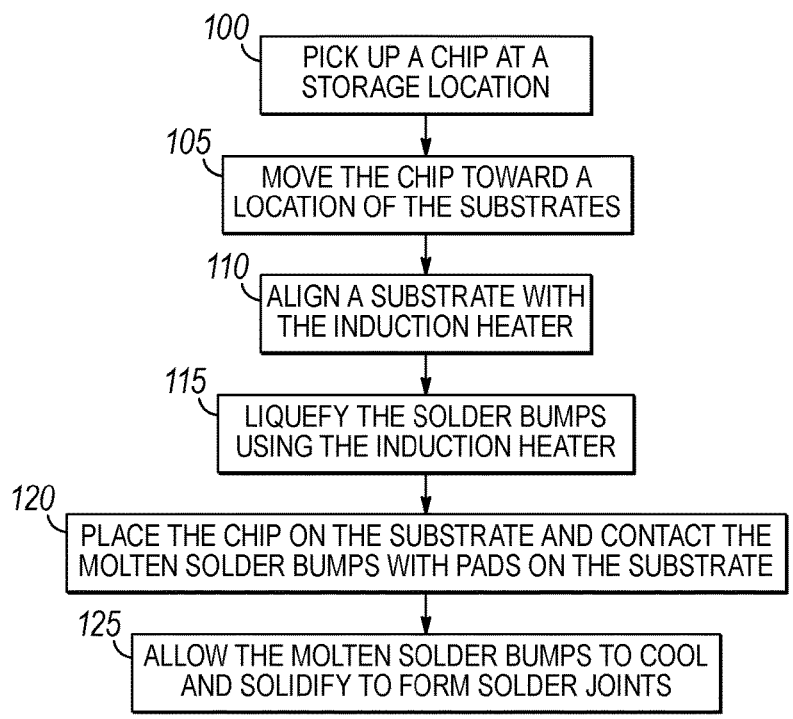
FIG. 5 is a flowchart that illustrates a sequence of operations that may be performed by the induction heating system.

FIG. 5 provides a flowchart that illustrates a sequence of operations that may be performed by the system 10 of FIG. 1 consistent with embodiments of the invention. The controller 18 may operate the pick-and-place machine 40 to move its pick-up head 42 to the storage location 44 and pick up the chip 12 at the storage location 44 (block 100). The controller 18 may operate the pick-and-place machine 40 to move its pick-up head 42, with the chip 12 secured to the pick-up head 42, in the motion path 43 toward the substrates 14 on the conveyor 60 (block 105). The motion path may be continuous and unbroken. The controller 18 may operate the conveyor 60 to align the substrate 14 that is the intended recipient of the chip 12 with the induction heater 48 (block 110). The solder bumps 50, and the chip 12, may be at room temperature while located at the storage location 44 and prior to heating by the induction heater 48.

During movement of the chip 12 from the storage location 44 to the substrate 14, the solid solder bumps 50 are melted or liquefied by electromagnetic induction using the induction heater 48 in a time that is less than the time required to complete the movement over the motion path 43 (block 115). Specifically, the controller 18 operates the power supply 46 to supply a time-varying current in the coil of the induction heater 48, which in turn produces a time-varying magnetic field in the space within and about the coil of the induction heater 48. For example, the power supply 46 may be triggered by the controller 18 to energize the induction heater 48 immediately before the chip 12 enters the coil. As the pick-up head 42 moves the chip 12 axially through the coil of the induction heater 48, the time variation of the magnetic field induces eddy currents in the electrically-conducting material comprising the solder bumps 50 that, due to the electrical resistance of the electrically-conducting material, heat by electromagnetic induction. The solder bumps 50 on the chip 12 may be simultaneously heated by the induction heater 48 to a temperature greater than the melting point of the constituent solder material. While in the liquid state, the solder bumps 50 remain coupled with the pads 52 on the moving chip 12.

The heating time and parameters for the high-frequency alternating current supplied to the induction heater 48 are selected to melt or liquefy the solder bumps 50. For example, the solder bumps 50 may be heated to a temperature that is greater than a melting point of the solder and to an absolute temperature that may be contingent upon solder composition among other factors, but that is typically in a range of 175° C. to 350° C. In one embodiment, the heating time required to liquefy (i.e., melt) the solid solder bumps 50 may be on the order of tens of microseconds. In another embodiment, the heating time required to liquefy the solid solder bumps 50 may range from twenty (20) microseconds to two hundred fifty (250) microseconds. In such time domains, the induction heating operation can be performed while placing the chip 12 on the substrate 14 with negligible additional impact on capacity and cycle time. During the operation of the induction heater 48, the chip 12 and the substrate 14 may not be heated.

The substrates 14 may be at room temperature or may be heated by the heater 58 prior to the chip 12 being placed on and joined to the substrate 14. Alternatively, the induction heater 48 may be used to locally heat the pads 54 at the time of joining by coupling of the time-varying magnetic field with the layer 56.

While the solder bumps 50 are in the liquid phase, the controller 18 may operate the pick and place machine to move its pick-up head 42 to place the chip 12 on the substrate 14 (block 120). For example, each solder bump 50 on the chip 12 may be placed into contact with one of the substrate pads 54 while the solder bumps 50 are liquid. The molten solder bumps 50 may react with one or more materials of the substrate pad 54 to provide a metallurgical bond. Either before or after contact between the molten solder bumps 50 and the substrate pads 54, the controller 18 may operate the power supply 46 to discontinue the time-varying current in the coil of the induction heater 48, and thereby cease the application of the time-varying magnetic field. With the source of heating eliminated, the solder bumps 50 can rapidly cool below their melting point and return to a solid phase to form the solder joints 16.

The solder joints 16 (FIG. 4) mechanically and electrically attach the chip 12 to the substrate 14 by bonding with the substrate pads 54 (block 125). Each solder joint 16 permanently attaches one of the chip pads 52 with one of the substrate pads 54. The process of FIG. 5 may be repeated until the supply of chips 12 and/or the supply of substrates 14 is exhausted and requires replenishment.

Forming the solder joints 16 with induction heating may reduce the impact of differences between the coefficients of thermal expansion between the materials of the chip 12 and substrate 14 during chip joining. In instances in which the chip 12 is primarily comprised of silicon and the substrate 14 is primarily comprised of an organic material (e.g., a plastic or polymer), the respective coefficients of thermal expansion may be highly mismatched and the substrate 14 may expand to a greater degree than the chip 12. The heating of the chip 12 and/or the substrate 14, if any, is to an extent that negates the impact of the mismatched coefficients of thermal expansion. As a result, the solder joints 16 may be more reliably produced and are less likely to de-bond from the substrate pads 54, and the substrate 14 may be less likely to warp or bow in response to the joining process so that the planarity of the substrate 14 is preserved. The use of induction heating during chip joining may also reduce or eliminate residual strain in the joined chip 12 and substrate 14 and/or reduce or eliminate misalignment between the solder bumps 50 and substrate pads 54 that may ordinarily be present due to different degrees of thermal expansion.

In addition, the use of induction heating may eliminate wear-out mechanisms associated with the exposure of certain type of substrates 14, such as plastic laminates, to an excessive number of heat cycles. These wear-out mechanisms may limit the number of permitted reworks of the solder joints 16. In addition, a reflow oven and associated equipment is not required to join the chip 12 with the substrate 14.

Figure 6:
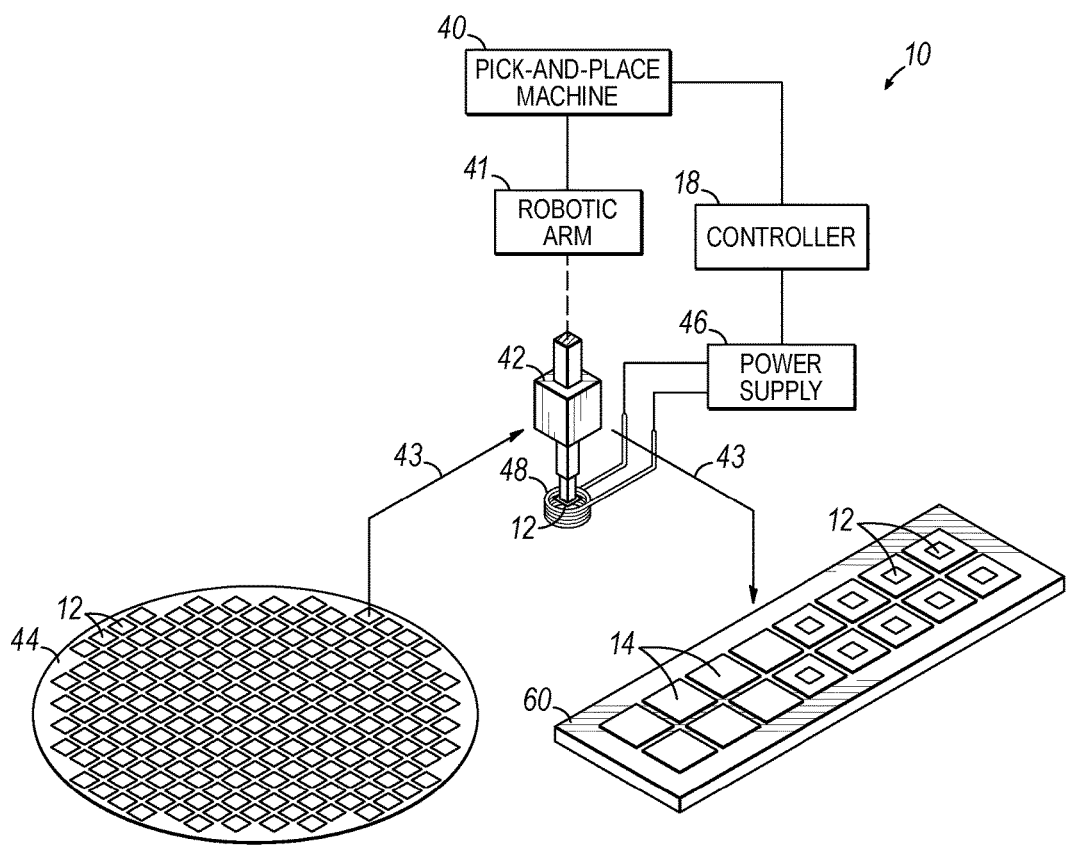
FIG. 6 is a diagrammatic view of an induction heating system in accordance with an alternative embodiment of the invention.

With reference to FIG. 6 in which like reference numerals refer to like features in FIGS. 1-5 and in accordance with an alternative embodiment, the induction heater 48 may be carried by the pick-up head 42 of the pick-and-place machine 40 instead of being stationed proximate to the substrates 14. As the pick-up head 42 is moved by the robotic arm 41, the induction heater 48 moves along with the pick-up head 42. The electrical connection of the induction heater 48 with the power supply 46 is configured to accommodate the mobility of the induction heater 48. If the induction heater 48 includes a coil, the coil may be wrapped about the portion of the pick-up head 42 that carries the chip 12 so that the chip 12 is at least partially surrounded by the coil and is coupled with the time-varying magnetic from the coil to provide heating by electromagnetic induction.

The induction heater 48 may be operated as discussed above to liquefy the solder bumps 50 during the time required for the pick-up head 42 to complete the motion over the motion path 43 from the storage location 44 to the substrate 14. This arrangement of components may enhance the flexibility in the timing relative to contact with the substrate pads 54 for the use of the induction heater 48 to change the phase of the solder bumps 50 from solid to liquid. The solder bumps 50 may be liquefied over any segment or portion of the motion path 43. For example, the solder bumps 50 may be heated by the induction heater 48 to provide the liquid phase immediately after the chip 12 is picked at the storage location 44 by the pick-up head 42.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. The chip may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for joining a chip with a substrate, the apparatus comprising:
   a pick-and-place machine including a pick-up head to for releasably holding the chip and a robotic arm for moving the pick-up head in a motion path;
   an induction heater including a plurality of coil turns located in the motion path directly over the substrate, the coil turns having an inner diameter defining an interior surface; and
   a power supply coupled with the induction heater, the power supply configured to supply electrical power with a time-varying alternating current to the coil turns of the induction heater for heating solder bumps on the chip by electromagnetic induction while the chip is releasably held by the pick-up head, wherein the pick-up head moves the chip axially through the interior surface of the coil turns and toward the substrate.

2. The apparatus of claim 1 wherein the pick-and-place machine continuously moves the pick-up head in the motion path toward the substrate as the induction heater heats the solder bumps.

3. The apparatus of claim 1 further comprising: a controller coupled with the power supply, the controller including at least one processor and a memory including program code that, when executed by the at least one processor, causes the power supply to supply the electrical power with the time-varying alternating current to the coil turns of the induction heater.

4. The apparatus of claim 3 wherein the controller is coupled with the pick-and-place machine, and the program code, when executed by the at least one processor, cause the robotic arm to move the pick-up head in the motion path in which the chip is moved axially through the interior surface of the coil turns.

5. The apparatus of claim 4 further comprising: a conveyor, wherein the controller is coupled with the conveyor, and the program code, when executed by the at least one processor, cause the conveyor to move the substrate to a location at which the coils turns are directly over the substrate.

6. The apparatus of claim 1 further comprising:
   a conveyor for moving the substrate into a location proximate to the induction heater.

7. The apparatus of claim 1 wherein the robotic arm is a programmable mechanical arm with a plurality of joints and a plurality of links connected by the joints that allow rotational motion and/or translational displacement of the pick-up head.

8. The apparatus of claim 1 wherein the induction heater has a fixed position in relation to the substrate as the pick-up head moves in the motion path.

* * * * *

UNITED STATES PATENT AND TRADEMARK OFFICE
CERTIFICATE OF CORRECTION

| | |
|---|---|
| PATENT NO. | : 10,245,667 B2 |
| APPLICATION NO. | : 15/654130 |
| DATED | : April 2, 2019 |
| INVENTOR(S) | : Stephen P. Ayotte |

It is certified that error appears in the above-identified patent and that said Letters Patent is hereby corrected as shown below:

In the Claims

Column 8, Claim 1, Line 33, after "head" delete "to"

Signed and Sealed this
Seventh Day of May, 2019

Andrei Iancu
*Director of the United States Patent and Trademark Office*